US012616031B2

(12) United States Patent
Choi et al.

(10) Patent No.: US 12,616,031 B2
(45) Date of Patent: Apr. 28, 2026

(54) ELECTROMAGNETIC SHIELDING STRUCTURE

(71) Applicant: Avago Technologies International Sales Pte. Limited, Singapore (SG)

(72) Inventors: Jin Seong Choi, Irvine, CA (US); Hyunsuk Chun, Irvine, CA (US); Sampath Karikalan, Irvine, CA (US); Kwok Cheung Tsang, Irvine, CA (US); Wen Hsien Huang, Hsinchu (TW); Hsi-Wei Wang, Hsinchu (TW); Chia Yuan Yu, Hsinchu (TW)

(73) Assignee: Avago Technologies International Sales Pte. Limited, Singapore (SG)

( * ) Notice: Subject to any disclaimer, the term of this patent is extended or adjusted under 35 U.S.C. 154(b) by 691 days.

(21) Appl. No.: 18/084,431

(22) Filed: Dec. 19, 2022

(65) Prior Publication Data

US 2024/0203898 A1     Jun. 20, 2024

(51) Int. Cl.
| | |
|---|---|
| *H01L 23/552* | (2006.01) |
| *H01L 23/13* | (2006.01) |
| *H01L 23/48* | (2006.01) |
| *H01L 23/498* | (2006.01) |
| *H01L 23/538* | (2006.01) |
| *H01L 23/66* | (2006.01) |

(52) U.S. Cl.
CPC ............ *H01L 23/552* (2013.01); *H01L 23/13* (2013.01); *H01L 23/481* (2013.01); *H01L 23/49827* (2013.01); *H01L 23/5384* (2013.01); *H01L 23/66* (2013.01)

(58) Field of Classification Search
CPC ............. H01L 23/481; H01L 23/49827; H01L 23/5384; H01L 23/552; H01L 23/66; H01L 23/13
See application file for complete search history.

(56) References Cited

U.S. PATENT DOCUMENTS

| | | | |
|---|---|---|---|
| 7,110,227 B2 * | 9/2006 | Anthony | ................. H01L 23/50 257/E23.079 |
| 8,541,993 B2 | 9/2013 | Notman et al. | |
| 8,890,628 B2 | 11/2014 | Nair et al. | |

(Continued)

FOREIGN PATENT DOCUMENTS

| | | |
|---|---|---|
| CN | 202873178 U | 4/2010 |
| CN | 101971326 B | 3/2013 |

(Continued)

OTHER PUBLICATIONS

Extended European Search Report on EP Appln. No. 23213394.2 dated Jul. 22, 2024.

*Primary Examiner* — Jose R Diaz
(74) *Attorney, Agent, or Firm* — Foley & Lardner LLP

(57) ABSTRACT

An EM shielding structure for a semiconductor package is embedded in a through hole of a core layer of the semiconductor package. The EM shielding structure may include multiple vias formed by a copper plating operation. Additionally, a metal way surrounds the EM shielding structures and prevents, along with a dielectric material, unwanted EM radiation (passing through the vias) from emanating throughout the semiconductor package. The EM shielding structure can also take the form of an insert that is adhered to the core layer at a through hole of the core layer.

20 Claims, 9 Drawing Sheets

(56)  References Cited

U.S. PATENT DOCUMENTS

|  |  |  |  |
|---|---|---|---|
| 9,041,208 | B2 | 5/2015 | Gallegos et al. |
| 10,410,971 | B2 | 9/2019 | Rae et al. |
| 10,937,726 | B1 | 3/2021 | Chen et al. |
| 2003/0168342 | A1 | 9/2003 | Chakravorty et al. |
| 2006/0214010 | A1 | 9/2006 | Chan et al. |
| 2006/0237227 | A1 | 10/2006 | Zhao et al. |
| 2007/0188257 | A1 | 8/2007 | Brunker et al. |
| 2007/0194431 | A1 | 8/2007 | Corisis et al. |
| 2007/0268085 | A1 | 11/2007 | Egan |
| 2008/0173476 | A1 | 7/2008 | Cotton |
| 2011/0299262 | A1 | 12/2011 | Crotty |
| 2012/0261181 | A1 | 10/2012 | Izawa et al. |
| 2013/0032931 | A1 | 2/2013 | Tsai et al. |
| 2015/0334821 | A1 | 11/2015 | Wu et al. |
| 2018/0108971 | A1 | 4/2018 | Connor et al. |
| 2019/0036232 | A1 | 1/2019 | Kang et al. |
| 2019/0304923 | A1 | 10/2019 | Shekhar et al. |
| 2020/0152580 | A1 | 5/2020 | Kim et al. |
| 2022/0157740 | A1 | 5/2022 | Verhaverbeke et al. |

FOREIGN PATENT DOCUMENTS

|  |  |  |  |
|---|---|---|---|
| CN | 109219332 | A | 1/2019 |
| EP | 4040615 | A1 | 8/2022 |
| WO | WO 2019/211833 | A1 | 11/2019 |
| WO | WO-2021/200094 | A1 | 10/2021 |

* cited by examiner

400d 412          424

404

400e 426          412          424

400f 422          412          428          414

410

ELECTROMAGNETIC SHIELDING STRUCTURE

TECHNICAL FIELD

The present description relates generally to semiconductor packaging including, for example, an electromagnetic shielding structure.

BACKGROUND

Semiconductor packages, including organic semiconductor packages, include a core layer, build-up layers, a metal plane with micro vias, and plated-through-hole (PTH) vias. Within a semiconductor package, PTH vias and pads form parasitic capacitance with nearby metals, leading to a half-wave resonant structure. Depending on the core thickness and material, the structure can have different resonant frequencies.

For applications including data centers, there is a strong demand for higher bandwidth, and faster serializer-deserializer (SerDes) circuits, such as SerDes circuits operable at about 224 Gigabits per second (Gbps) or beyond. In these faster SerDes circuits, the signal integrity requirement, when accounting for crosstalk (XTK) and insertion loss (IL), become quite challenging to meet. For example, when the half-wave resonance occurs at SerDes Nyquist frequency, excessive XTK and IL may occur, thereby significantly degrading the system performance, and acting as a gating factor for the future development of ultra-high bandwidth SerDes circuits.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block-diagram form in order to avoid obscuring the concepts of the subject technology.

According to some aspects, the subject technology is directed to an electromagnetic (EM) shielding structure introduced in a semiconductor package core layer to block EM interference, including half-wave EM radiation from PTH vias, thus allowing the EM shielding structure to be integrated with high-speed data transmission circuits, including serializer-deserializer (SerDes) circuits operable at high frequencies at 224 Gbps or greater. EM shielding structures described herein can take the form of an EM shielding insert that can be inserted into a through hole, or opening, of a core of an integrated circuit package. In this regard, EM shielding structures can be selectively implemented wherever needed in a core layer, of the package, and in various shapes and configurations. For instance, the EM shielding structures of the subject disclosure can be implemented as built-in shielding structures, using plug-in material (e.g., dielectric material) and copper (e.g., electrolyte copper coating), discrete coaxial structures, or in differential configurations, as discussed in more detail herein.

The disclosed EM shielding structures includes a number of advantageous features. For example, the EM shielding structures of the subject technology uses less space compared to existing shielding structures due to implementation in the differential configuration and can readily suppress a resonant XTK in high-speed applications. Furthermore, the disclosed EM shielding structures can be easily fabricated, using current semiconductor processing and organic substrate technology, as built-in structures or discrete coaxial structures, with reduced substrate dimensions.

Figure 1:
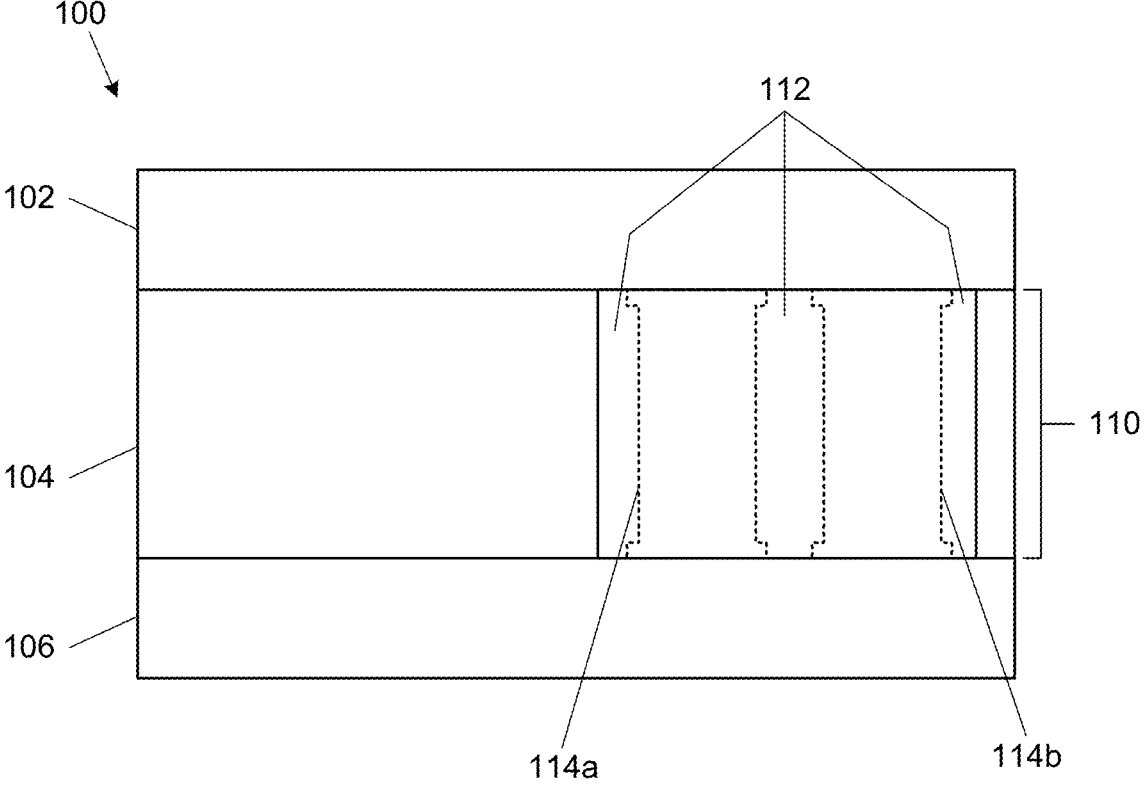
FIG. 1 illustrates an example semiconductor package including an EM shielding structure, according to aspects of the subject technology.

FIG. 1 illustrates an example of a semiconductor package 100, according to aspects of the subject technology. The semiconductor package 100 includes, but is not limited to, a top buildup layer (buildup 1) 102, a core layer 104, a bottom buildup layer (buildup 2) 106. An EM shielding structure 110 of the subject technology is created inside the core layer 104. In some aspects, the core layer 104 has a thickness of almost equal to the half wavelength (λ/2) corresponding to the operating frequency (e.g., about 56 Gigahertz (GHz)). However, the core layer 104 may have thicknesses greater than or less than λ/2 corresponding to the operating frequency. Although not shown, the buildup layer 102 may include a number of vias connected to respective bump (e.g., electrical connection point) that matches a bump in an integrated circuit or module (not shown for simplicity). Similarly, the buildup layer 106 can have several vias and respective bumps.

In some implementations, the EM shielding structure 110 of the subject technology is a built-in differential coaxial EM shielding structure fabricated within a dielectric material 112 (e.g., plug-in material) and electrolyte copper coating. The EM shielding structure 110 includes two side-by-side coaxial structures, e.g., a via 114a and a via 114b, implemented across an entire thickness of the core layer 104. The vias 114a and 114b may each include a plated via formed within the dielectric material 112. Additional features and enhancements, including a plated copper operation, will be shown and described further below.

The EM shielding structure 110 can be readily fabricated by utilizing an organic substrate and current semiconductor processing technology with reduced substrate dimensions. Beneficially, the EM shielding structure 110 of the subject technology uses less space compared to existing shielding structures due to implementation in the differential configuration. The EM shielding structure 110 can block half-wave EM radiation from the vias 114a and 114b, even in applications with high-speed circuits (e.g., greater than about 56 GHz).

Also, while the core layer 104 represents a single core, in some embodiments, a semiconductor package may include a multi-core processor (e.g., dual-core, quad-core, etc.) with features shown and described for the core layer 104, as well as other core layers shown and described below.

Figures 2A, 2B:
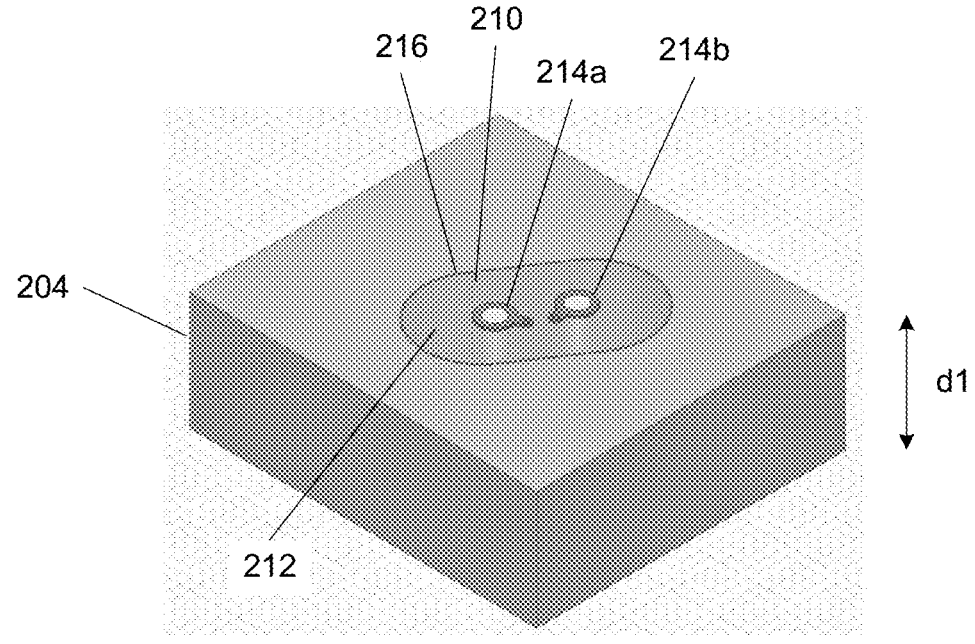
FIGS. 2A and 2B illustrate examples of a built-in differential coaxial EM shielding structures, according to aspects of the subject technology.

FIGS. 2A and 2B illustrate examples of an EM shielding structure 210, according to aspects of the subject technology. As shown, the EM shielding structure 210 includes a via 214a and a via 214b, each of which are embedded in a dielectric material 212. The EM shielding structure 210 is disposed in a through hole 216, or opening, of the core layer 204 (e.g., similar to the core layer 104 of FIG. 1) having a hole within which the EM shielding structure 210 is inserted. The through hole 216 represents an opening in the core layer 204 into which the EM shielding structure 210 is inserted. Also, the EM shield structure 210 includes a dimension d1, or height, approximately within the range of 1.2 to 1.25 millimeters (mm). The EM shielding structure 210 provides the differential coaxial EM shield. As shown, the through hole 216 includes an oblong shape, and the EM shielding structure 210 includes a corresponding shape (e.g., corresponding oblong shape of similar dimensions as those of the through hole 216).

As shown in FIG. 2B, the EM shielding structure 210 includes a dielectric material 212 (e.g., made of a plug-in material), with a dimension d2, or length, approximately within a range of 1.8 mm to 2.2 mm, and a dimension d3, or width, approximately within a range of about 1.1 mm to 1.3 mm. The vias 214a and 214b are formed into respective through holes of the dielectric materials, with the through holes having a diameter approximately within the range of 190 micrometers (μm) to 210 μm. Additionally, a wall 218 formed from an electrically conductive material (e.g., copper) surrounds the dielectric material 212. By "surround" or "surrounding," a structure may form a border and at least wrap around one or more structures. The wall 218 may be integrated with the dielectric material 212 prior to inserting the EM shielding structure 210 into the core layer 204. For example, the wall 218 may wrap around the dielectric material 212 in a sub-assembly, and then the combination of the wall 218 and the dielectric material 212 (and any components carried by the dielectric material 212) is inserted into the through hole 216 of the core layer 204. Alternatively, the wall 218 can be formed/plated onto the core layer 204. Also, the wall 218 takes the shape of the through hole 216 (shown in FIG. 2A) and the EM shielding structure 210. Put another way, the wall 218 conforms to the shape of the through hole 216. The wall 218 takes the form of a metal that blocks or prevents EM radiation (passing through the vias 214a and 214b) from exiting the EM shielding structure 210.

Figure 3A:
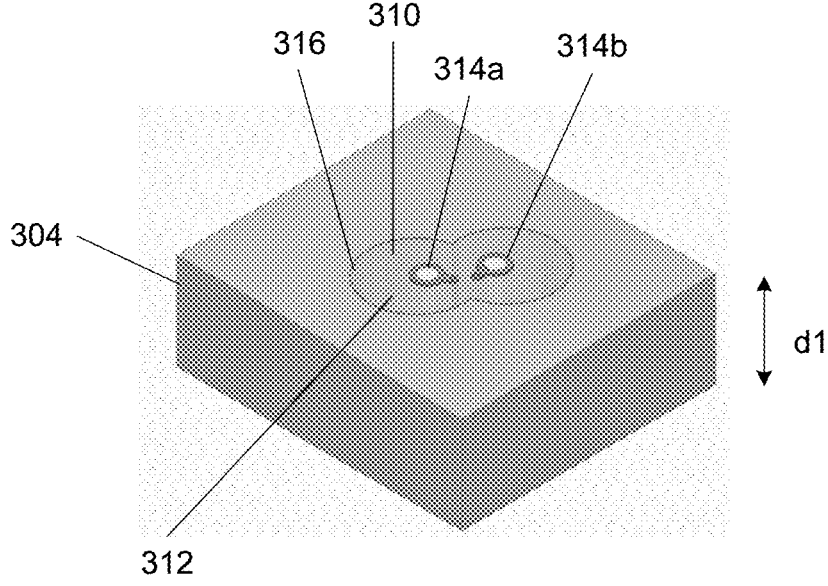
FIGS. 3A and 3B illustrate examples of an alternate built-in differential coaxial EM shielding structures, according to aspects of the subject technology.
Figure 3B:
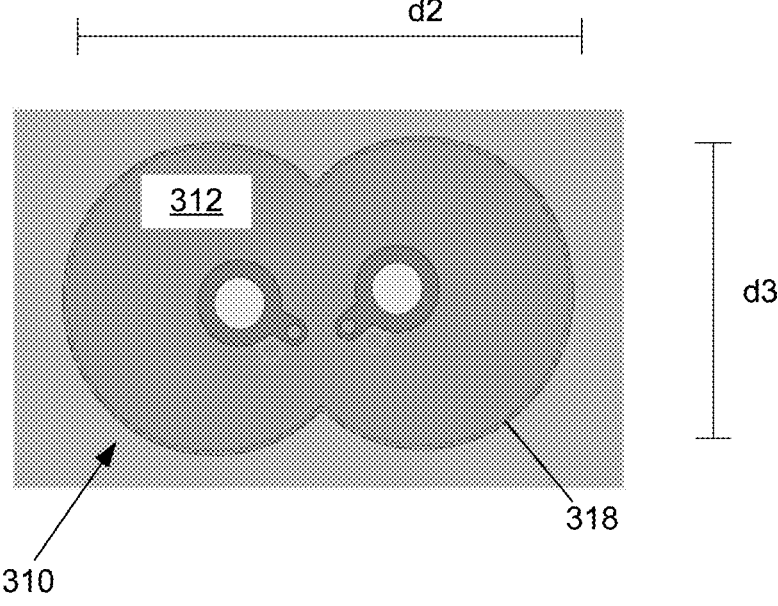
Figure 4A:
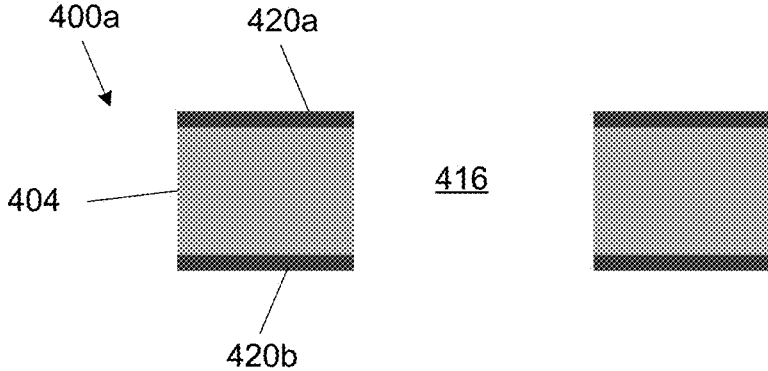
FIGS. 4A, 4B, 4C, 4D, 4E and 4F illustrate schematic diagrams of example implementation steps of a built-in coaxial EM shielding structure, according to aspects of the subject technology.
Figure 4B:
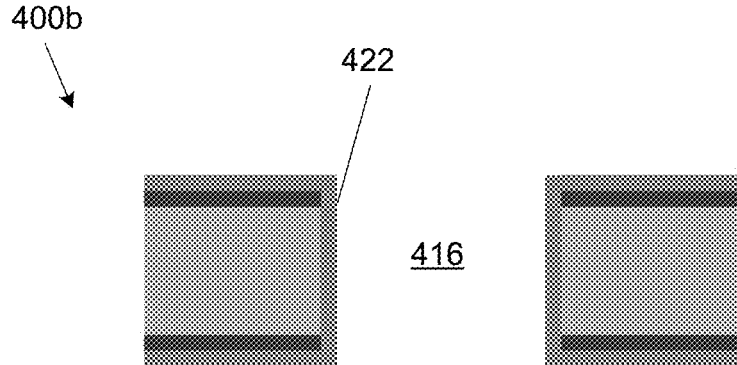
Figure 4C:
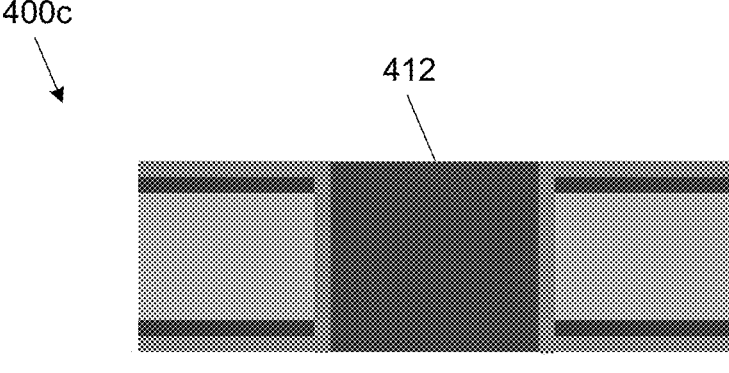
Figure 4D:
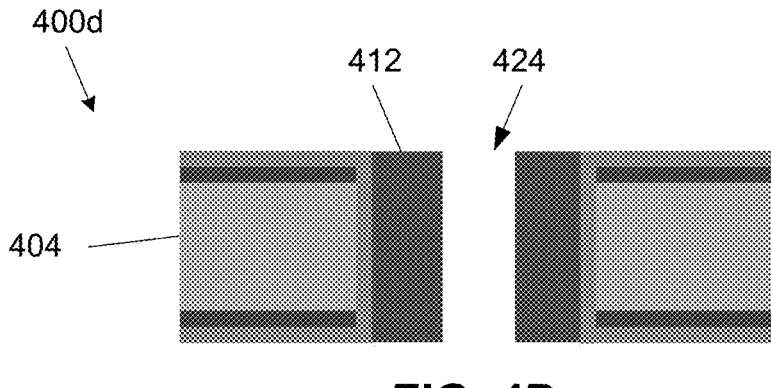
Figure 4E:
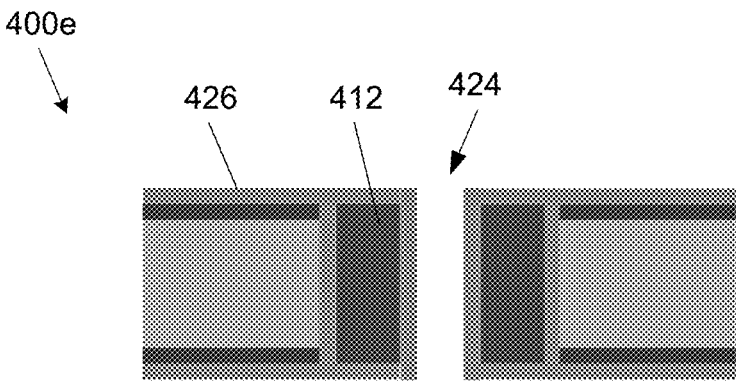
Figure 4F:
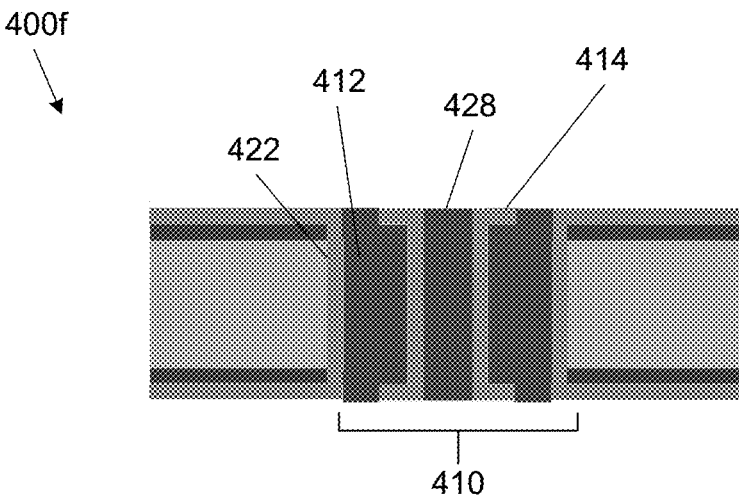

FIGS. 3A and 3B illustrate examples of an EM shielding structure 310, according to aspects of the subject technology. As shown, the EM shielding structure 310 includes a via 314a and a via 314b, each of which are embedded in a dielectric material 312. The EM shielding structure 310 is inserted into a through hole 316, or opening, of the core layer 304 (e.g., similar to the core layer 104 of FIG. 1) having a hole within which the EM shielding structure 310 is inserted. Accordingly, the through hole 316 represents an opening in the core layer 304 into which the EM shielding structure 310 is inserted. As shown, the through hole 316 includes a shape formed by two intersecting circles, and the EM shielding structure 310 includes a corresponding shape (e.g., two intersecting circles with a shape of similar dimensions as those of the through hole 316). Additionally, a wall 318 formed from an electrically conductive material (e.g., copper) surrounds the dielectric material 312. Similar to the wall 218 (shown in FIGS. 2A and 2B), the wall 318 may be integrated with the dielectric material 312 prior to inserting the EM shielding structure 310 into the core layer 304 or can be formed/plated onto the core layer 304. Also, the wall 318 takes the shape of the through hole 316 (shown in FIG. 3A) and the EM shielding structure 310. Put another way, the wall 318 conforms to the shape of the through hole 316. The EM shielding structures includes dimensions d1, d2, and d3, each of which are similar to d1, d2, and d3, respectively, shown in FIG. 2A or 2B.

Referring to FIGS. 2A-3B, the shape (e.g., oblong shape versus two intersecting circles) of an EM shielding structure may be selected based on manufacturing considerations. Additionally, a shape and size of the EM shielding structure may be selected for impedance requirements. Moreover, other shapes not shown herein may be used. For example, an EM shielding structure may include a circular shape.

FIGS. 4A, 4B, 4C, 4D, 4E, and 4F illustrate schematic diagrams of example implementation steps for making an EM shielding structure and building the EM shielding structure into a core layer 404, according to aspects of the subject technology. In the implementation step 400a, a through hole 416 is formed (e.g., drilled) in a substrate made of a core layer 404. The through hole 416, being formed in the core layer 404, may be referred to as a core through hole. Additionally, a conductor layer 420a and a conductor layer 420b (e.g., copper foils) are applied to opposing surfaces of the core layer 404. In the implementation step 400b, the structure formed by the implementation step 400a is coated/surrounded with a conductor layer 422 (e.g., copper plating), which covers multiple surfaces of the core layer 404, including an outer surface defined by the through hole 416. In the implementation step 400c, the through hole 416 (not labeled) is filled with a dielectric material 412 (e.g., a plug-in material) to form a dielectric region.

In the implementation step 400d, a portion of the dielectric material 412 is etched to create a through hole 424. The through hole 424, being formed in the dielectric material 412, may be referred to as a dielectric through hole. In the implementation step 400e the structure formed by the implementation step 400e is coated with a conductor layer 426 (e.g., additional copper plating), which covers the dielectric material 412, the walls of the through hole 424, and multiple surfaces (e.g., opposing surfaces) of the core layer 404. The term "cover" or "covers" may refer to a structure that lies on another structure (or structures), and may or may not completely obscure the other structure(s). In the implementation step 400f, the through hole 424 is filled with a dielectric material 428 (e.g., a plug-in material). In this regard, the dielectric material 412 and the dielectric material 428 form a first dielectric region and a second dielectric region, respectively. Also, the conductor layer 422 may wrap around the via 414 and the dielectric materials 412 and 428, thus forming a wall similar to the wall 218 and the wall 318

(shown in FIGS. 2B and 3B, respectively). Though one or more additional processes (e.g., cutting, etching), portions of the conductor layer 426 (shown in FIG. 4E) are removed and the resulting structure includes a via 414, similar to vias shown in prior embodiments. Accordingly, the via 414 is formed from a metal formed from the conductor layer 426. Also, as the conductor layer 426 may include copper plating applied to the dielectric material 412 by a plating operation, the via 414 formed by the removal of the conductor layer 426 may be referred to as a PTH via. As a result of implementation steps 400a-400f, an EM shielding structure 410 is formed. The EM shielding structure 410 is designed to provide benefits, such as blocking half-wave EM radiation from one or more PTH vias of high-speed circuits (e.g., greater than about 56 GHz).

Figure 5:
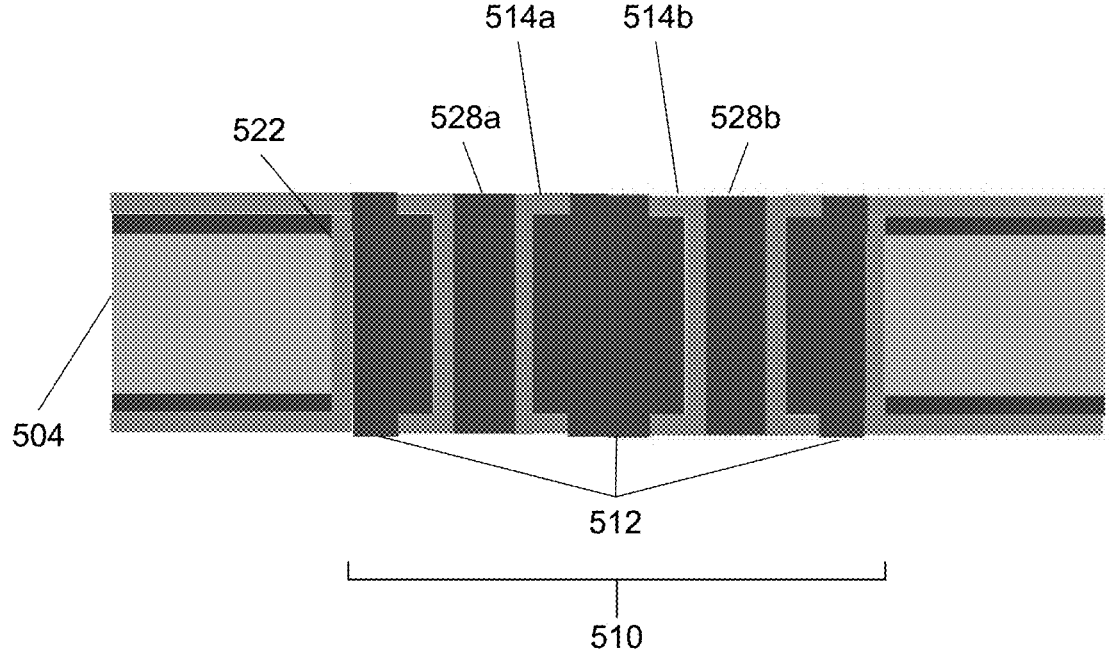
FIG. 5 illustrates an EM shielding structure for a dual-via assembly in a core layer, according to aspects of the subject technology.

FIG. 5 illustrates an EM shielding structure 510 for a dual-via assembly in a core layer 504, according to aspects of the subject technology. As shown, an EM shielding structure 510 is positioned in the core layer 504. The EM shielding structure 510 includes a via 514a and a via 514b. Further, EM shielding structure 510 includes a dielectric material 512 is external to, and between, the vias 514a and 514b. Further, the EM shielding structure 510 includes a dielectric material 528a and a dielectric material 528b positioned within the via 514a and the via 514b, respectively. Additionally, the EM shielding structure 510 further includes a conductor layer 522 that can wrap around the vias 514a and 514b, as well as the dielectric materials 512 and 528, thus forming a wall similar to the wall 218 and the wall 318 (shown in FIGS. 2B and 3B, respectively). The process shown in implementation steps 400a-400f (of FIGS. 4A-4F, respectively) can be used to form the dual-via assembly.

Figure 6:
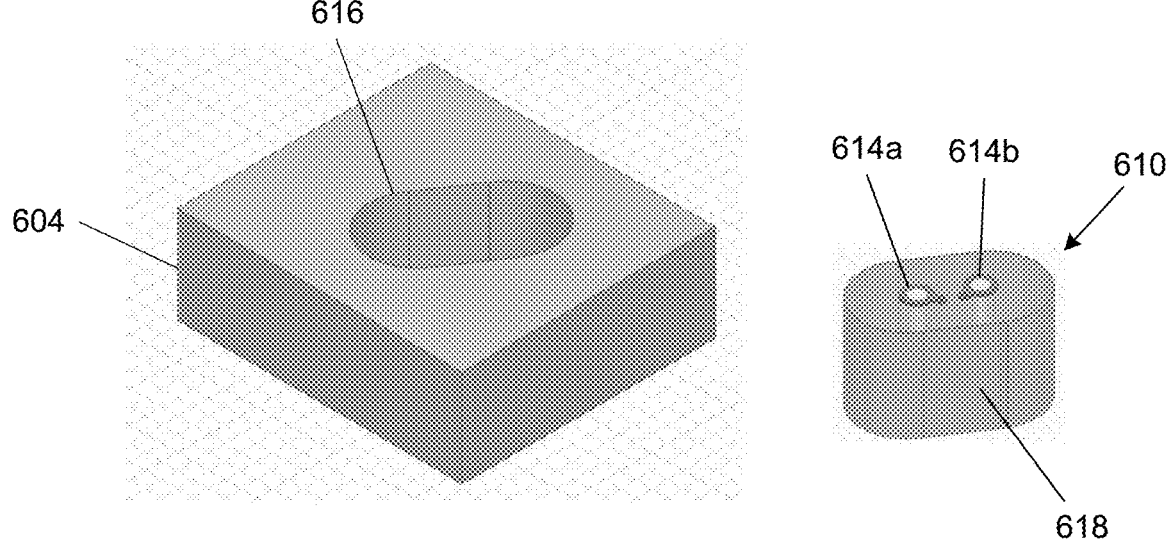
FIGS. 6 and 7 illustrate diagrams showing examples of add-in differential coaxial EM shielding structures, according to aspects of the subject technology.
Figure 7:
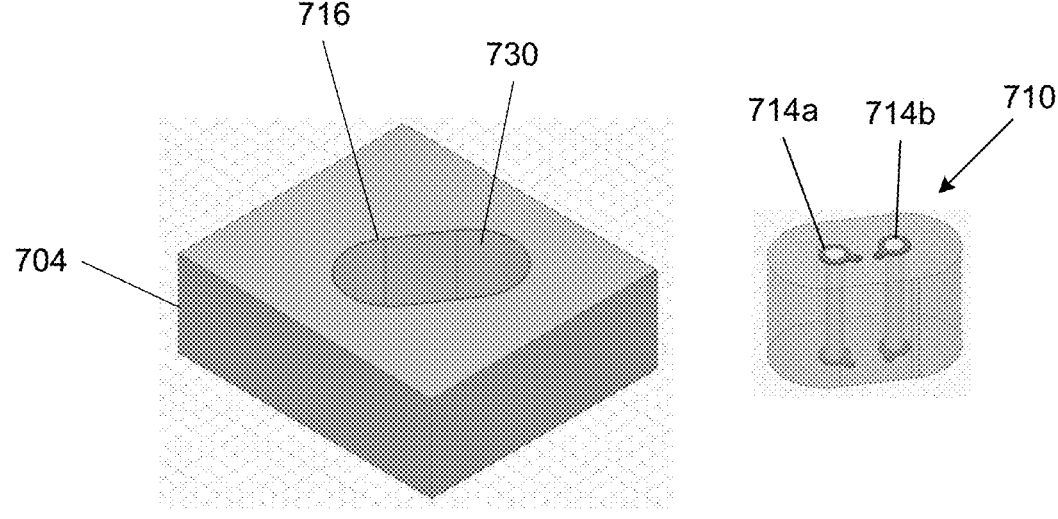

FIGS. 6 and 7 illustrate examples of add-in differential coaxial EM shielding structures, according to aspects of the subject technology. FIG. 6 shows a core layer 604 with a through hole 616, and an EM shielding structure 610 with a shape corresponding to that of the through hole 616. The EM shielding structure 610 includes a via 614a and a via 614b. Additionally, the EM shielding structure 610 includes a wall 618 (e.g., metal wall formed from copper). Based on EM shielding structure 610 having the wall 618 integrated therein, the core layer 604 may include non-metal and/or other dielectric materials at the through hole 616. As a result, the EM shielding structure 610 can take the form of a pre-assembled EM insert, having a wall 618 thereon, that can subsequently be inserted into the core layer 604 at the through hole 616.

Conversely, FIG. 7 shows a core layer 704 with a through hole 716, and an EM shielding structure 710 with a shape corresponding to that of the through hole 716. The EM shielding structure 710 includes a via 714a and a via 714b but lacks a metal wall. However, the core layer 704 may include a metal 730 at the through hole 716. The metal 730 may take the form of a metal insert with the through hole 716 formed therein, or a metal layer plated to the through hole 716. As a result, the EM shielding structure 710 can take the form of an alternate pre-assembled EM insert, without having to have a wall formed thereon, that can subsequently be inserted into the core layer 704 at the through hole 716.

Referring to FIGS. 6 and 7, the EM shielding structure 610 and the EM shielding structure 710, respectively, that can shield EM radiation passing through either or both of the vias 614a and 614b or the vias 714a and 714b, respectively. The EM shielding performance of the EM shielding structure 610 and the EM shielding structure 710 may be similar despite the different structures. Also, while an oblong shape for the through holes 616 and 716 in FIGS. 6 and 7, respectively, are shown, the through holes may take different shapes. For example, the shape with two intersecting circles (e.g., FIGS. 3A and 3B) may substitute for the oblong shape. Additionally, the EM shielding structures 610 and 710 can be secured or adhered with the core layers 604 and 704, respectively, using a glue or adhesive (not shown), as non-limiting examples, at the through holes 616 and 716, respectively.

Figure 8:
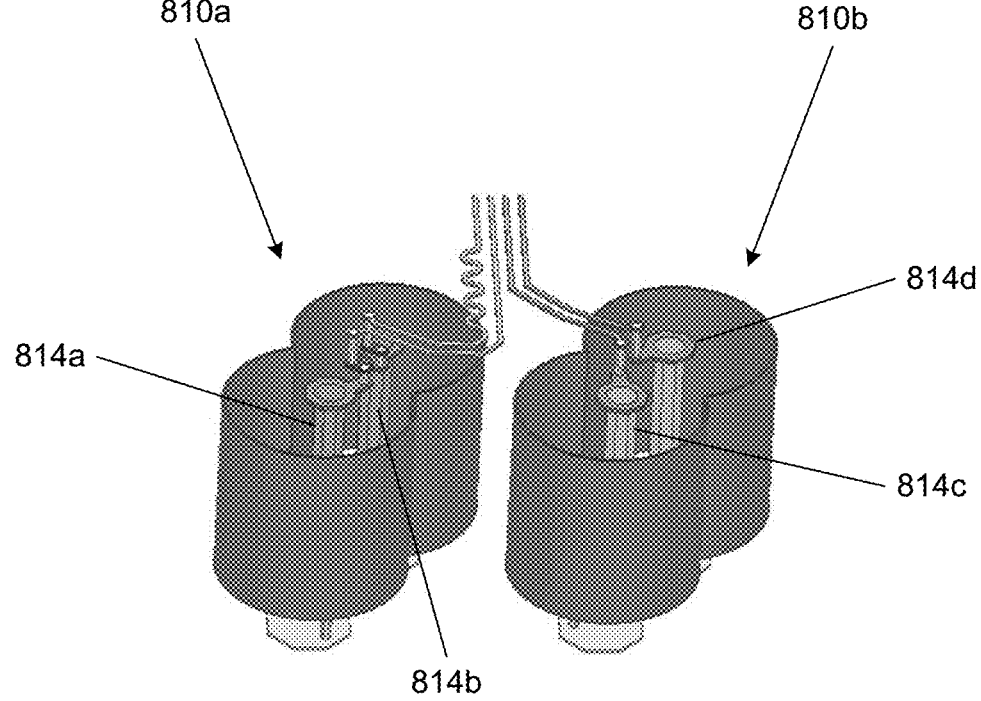
FIG. 8 illustrates an example coaxial EM shielding structure, according to aspects of the subject technology.

FIG. 8 illustrates an example of EM shielding structures. An EM shielding structure 810a and an EM shielding structure 810b are shown. The EM shielding structure 810a includes a via 814a and a via 814b, and the EM shielding structures 810b includes a via 814c and a via 814d. Although specific shapes are shown, the EM shielding structures 810a and 810b may include any features shown and described herein for an EM shielding structure.

Figure 9:
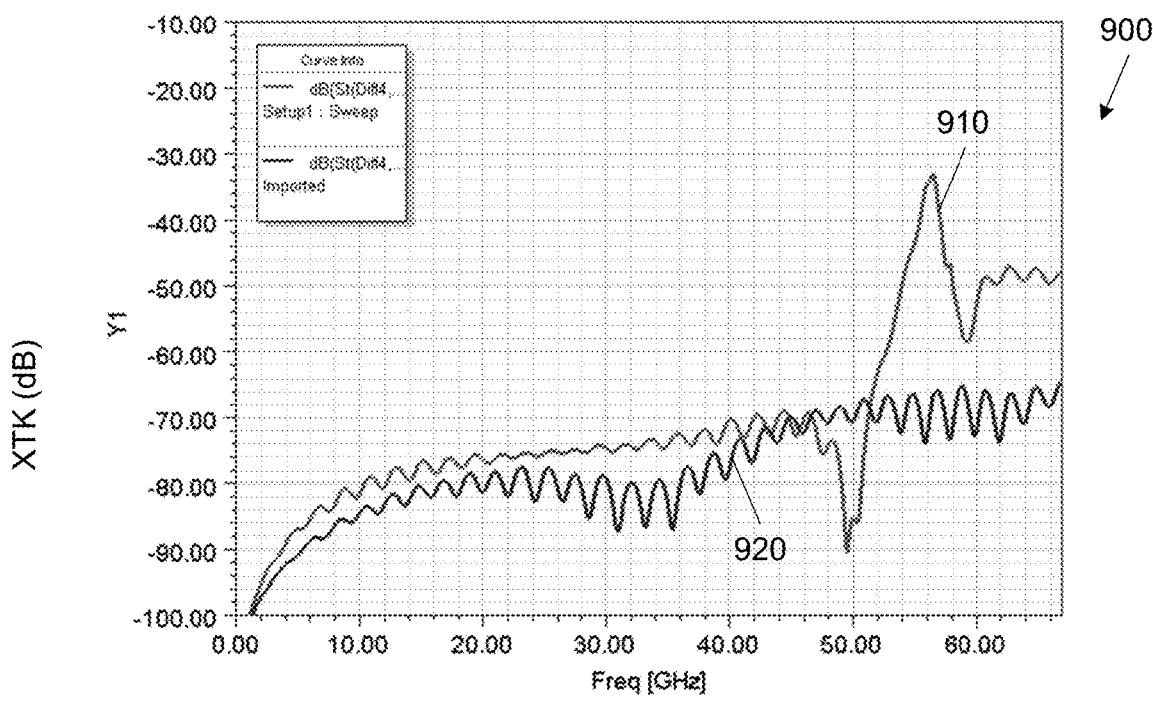
FIG. 9 illustrates a chart illustrating plots of simulated XTK versus the frequency of a traditional and a disclosed coaxial EM shielding structure.
Figure 10:
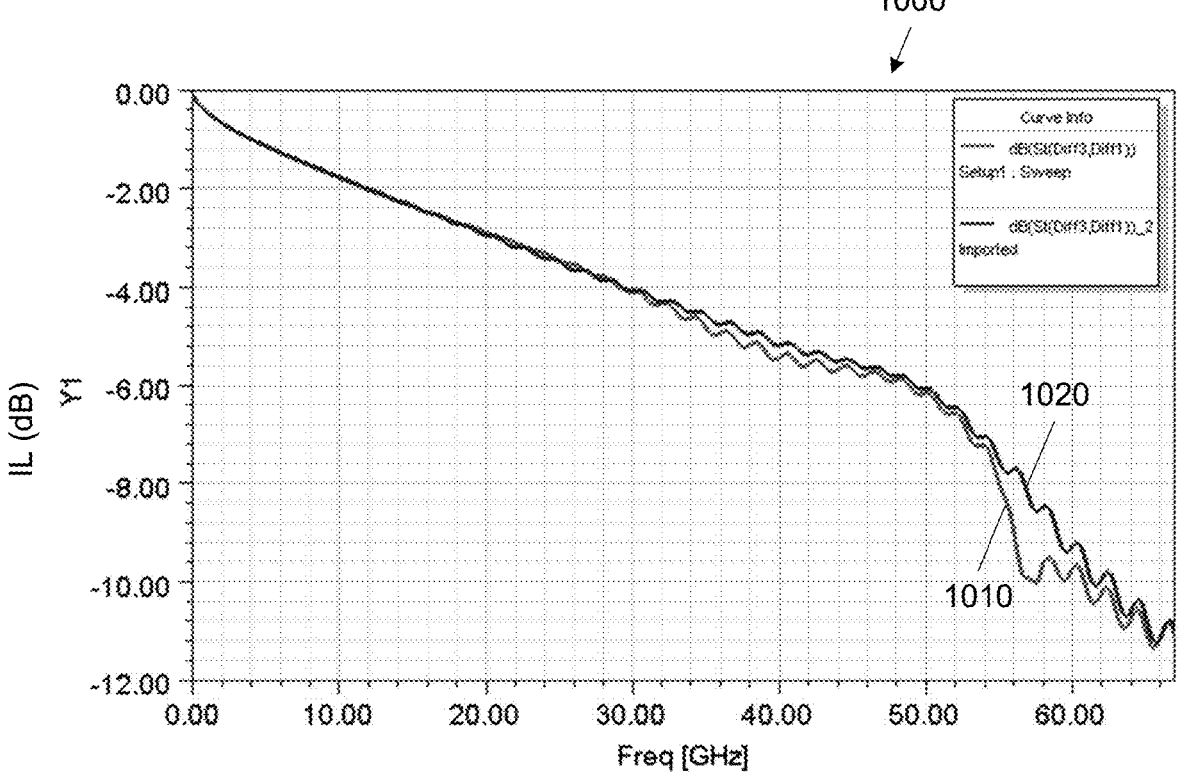
FIG. 10 illustrates a chart illustrating plots of simulated insertion loss versus the frequency of a traditional and a disclosed coaxial EM shielding structure.

FIGS. 9 and 10 illustrate charts comparing traditional EM shield with disclosed EM shields. A "disclosed EM shield" may refer to EM shields of the subject technology shown and described herein. A "traditional EM shield" refers to an EM shield that lacks, for example, both a dielectric material surrounding and between the vias, as well as a metal wall.

FIG. 9 illustrates a chart 900 illustrating plots of simulated XTK versus the frequency of a traditional and an EM shielding structure of the subject technology. The chart 900 includes a plot 910 and a plot 920. The plot 910 depicts variation of the XTK (in decibels (dB)) versus frequency (GHz) for a traditional EM shielding structures and the plot 920 depicts variation of the XTK (dB) versus frequency (GHz) for a disclosed EM shielding structure of the subject technology. The plot 920 shows an improved XTK characteristic. For example, at frequencies of interest (e.g., around 56 GHZ), the XTK of the disclosed differential coaxial EM shielding structure shows an improvement (i.e., reduction) of about 33 dB (−33 dB−−66 dB). Accordingly, at or near the Nyquist frequency, the EM is blocked by the disclosed EM shielding structure.

FIG. 10 illustrates a chart 1000 illustrating plots of simulated insertion loss versus the frequency of a traditional and an EM shielding structure of the subject technology. The chart 1000 includes a plot 1010 and a plot 1020. The plot 1010 depicts variation of the IL (dB) versus frequency (Hz) and the plot 1020 depicts variation of the IL (dB) versus frequency (GHz) for a disclosed EM shielding structure of the subject technology. The plot 1020 shows an improved IL characteristic. For example, at a location between 50 GHz to 60 GHz, the IL of the disclosed differential coaxial EM shielding structure shows an improvement (i.e., increase) of about 2.3 dB. Put another way, the insertion loss is greater for a traditional EM shield than that of the disclosed EM shield.

The previous description is provided to enable any person skilled in the art to practice the various aspects described herein. Various modifications to these aspects will be readily-apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one", unless specifically so stated, but rather "one or more." Unless specifically stated otherwise, the term "some" refers to "one or more." Pronouns in the masculine (e.g., his), include the feminine and neuter gender (e.g., her and its), and vice versa. Headings and subheadings, if any, are used for convenience only, and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation, or a component, may also mean the processor being programmed to monitor and control the operation, or the processor being operable to monitor and control the operation. Likewise, a processor configured to execute code can be construed as a processor programmed to execute code, or operable to execute code.

A phrase such as an "aspect" does not imply that such aspect is essential to the subject technology, or that such aspect applies to all configurations of the subject technology. A disclosure relating to an aspect may apply to all configurations, or one or more configurations. A phrase such as an "aspect" may refer to "one or more aspects", and vice versa. A phrase such as a "configuration" does not imply that such configuration is essential to the subject technology, or that such configuration applies to all configurations of the subject technology. A disclosure relating to a configuration may apply to all configurations, or one or more configurations. A phrase such as a "configuration" may refer to "one or more configurations", and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known, or later come to be known, to those of ordinary skill in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise", as "comprise" is interpreted when employed as a transitional word in a claim.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. A semiconductor package, comprising:
a core layer;
a through hole formed in the core layer; and
an electromagnetic (EM) shielding structure comprising a pre-assembled EM insert adapted to be inserted into the through hole
wherein the pre-assembled EM insert comprises:
a dielectric material,
a first via disposed in the dielectric material, and
a second via disposed in the dielectric material.

2. The semiconductor package of claim 1, further comprising a wall disposed in the through hole between the core layer and the EM shielding structure.

3. The semiconductor package of claim 2, wherein the wall is plated to a surface defined by the through hole.

4. The semiconductor package of claim 2, wherein the wall comprises a metal wall.

5. The semiconductor package of claim 2, wherein the wall is configured to prevent EM radiation passing through the first via and the second via from entering the core layer.

6. The semiconductor package of claim 1, wherein:
the through hole has a first shape, and
the EM shielding structure has a second shape that corresponds to the first shape.

7. The semiconductor package of claim 6, further comprising a metal disposed in the through hole, wherein the metal conforms to the first shape.

8. The semiconductor package of claim 1, further comprising an adhesive configured to adhere the EM shielding structure to the core layer.

9. The semiconductor package of claim 1, further comprising a conductor layer disposed on the core layer.

10. The semiconductor package of claim 1, wherein the dielectric material i) surrounds the first via and the second via and ii) is disposed between the first via and the second via.

11. A semiconductor package, comprising:
a core layer;
a core through hole formed in the core layer, the core through hole defining a surface; and
a pre-assembled EM insert adapted to be inserted into the core through hole,
wherein the pre-assembled EM insert comprises:
a dielectric material disposed in the core through hole, the dielectric material forming a first dielectric through hole and a second dielectric through hole;
a first metal layer plated to the first dielectric through hole; and
a second metal layer plated to the second dielectric through hole, wherein the first metal layer comprises a first via and the second metal layer comprises a second via.

12. The semiconductor package of claim 11, further comprising a third metal layer that surrounds the dielectric material.

13. The semiconductor package of claim 12, wherein the third metal layer conforms to a shape of the core through hole.

14. The semiconductor package of claim 12, further comprising an adhesive configured to adhere the dielectric material to the third metal layer.

15. The semiconductor package of claim 12, further comprising an adhesive configured to adhere the third metal layer to the core layer at the core through hole.

16. The semiconductor package of claim 11, further comprising a copper plating that covers multiple surfaces of the core layer.

17. An electromagnetic (EM) shielding insert for a core of a semiconductor package, the EM shielding insert comprising a pre-assembled EM insert adapted to be inserted into a through hole, wherein the pre-assembled EM insert comprises:
  a dielectric material that includes a first through hole and a second through hole;
  a first via disposed in the first through hole;
  a second via disposed in the second through hole; and
  a metal layer surrounding the dielectric material.

18. The EM shielding insert of claim 17, wherein the metal layer is configured to prevent EM radiation from exiting the EM shielding insert.

19. The EM shielding insert of claim 17, wherein the dielectric material comprises a shape corresponding to a through hole of the core.

20. The EM shielding insert of claim 17, wherein the dielectric material i) surrounds the first via and the second via and ii) is disposed between the first via and the second via.

* * * * *